United States Patent
Igarashi et al.

(10) Patent No.: US 8,758,907 B2
(45) Date of Patent: Jun. 24, 2014

(54) SURFACE COATED CUTTING TOOL WITH EXCELLENT CHIPPING RESISTANCE

(75) Inventors: Makoto Igarashi, Naka (JP); Kohei Tomita, Joso (JP); Eiji Nakamura, Naka (JP); Akira Osada, Naka (JP)

(73) Assignee: Mitsubishi Materials Corporation, Tokyo (JP)

( * ) Notice: Subject to any disclaimer, the term of this patent is extended or adjusted under 35 U.S.C. 154(b) by 20 days.

(21) Appl. No.: 13/504,243

(22) PCT Filed: Nov. 1, 2010

(86) PCT No.: PCT/JP2010/069420
§ 371 (c)(1),
(2), (4) Date: Jul. 16, 2012

(87) PCT Pub. No.: WO2011/052767
PCT Pub. Date: May 5, 2011

(65) Prior Publication Data
US 2012/0269589 A1 Oct. 25, 2012

(30) Foreign Application Priority Data

Oct. 30, 2009 (JP) ................ P2009-250199
Mar. 23, 2010 (JP) ................ P2010-065527
Oct. 6, 2010 (JP) ................ P2010-226353
Oct. 6, 2010 (JP) ................ P2010-226354

(51) Int. Cl.
*B23B 9/04* (2006.01)
*B23D 3/04* (2006.01)
*B23P 15/28* (2006.01)

(52) U.S. Cl.
USPC ........ 428/698; 428/701; 428/702; 428/908.8; 428/472; 428/220; 51/307; 51/309; 407/119

(58) Field of Classification Search
None
See application file for complete search history.

(56) References Cited

U.S. PATENT DOCUMENTS 4,474,849 A 10/1984 Fujimori et al.
5,945,207 A * 8/1999 Kutscher et al. ............. 428/216
(Continued)

FOREIGN PATENT DOCUMENTS

CN 1524653 A 9/2004
CN 101468401 A 7/2009
(Continued)

OTHER PUBLICATIONS

Toshio Ishii et al., "Microstructural investigation of α-$Al_2O_3$-epitaxially coated cemented carbide cutting tools," Journal of Vacuum Science and Technology A, vol. 19, No. 2, Mar. 2001, pp. 633-639.
(Continued)

*Primary Examiner* — Gwendolyn Blackwell
*Assistant Examiner* — Seth Dumbris
(74) *Attorney, Agent, or Firm* — Edwards Wildman Palmer LLP

(57) ABSTRACT

Provided is a surface coated cutting tool in which a hard coating layer exhibits excellent chipping resistance in high-speed intermittent cutting processes. In the surface coated cutting tool having the hard coating layer including a lower layer (Ti compound layer) and an upper layer ($Al_2O_3$ layer) formed by vapor-deposition on the surface of the cutting tool body constituted by a WC-based cemented carbide or TiCN-based cermet, the ratio b/a of the number a of crystal grains in the Ti compound layer present in the interface to which the lower layer and the upper layer are adjacent to the number b of crystal grains in the $Al_2O_3$ layer is $4 \leq b/a \leq 20$, and, furthermore, the average grain diameter of crystal grains in the Ti compound layer immediately below the $Al_2O_3$ layer is 0.5 μm or less.

5 Claims, 4 Drawing Sheets

(56) References Cited

U.S. PATENT DOCUMENTS

| | | | |
|---|---|---|---|
| 7,531,214 B2 * | 5/2009 | Ljungberg | 427/255.31 |
| 2007/0190250 A1 * | 8/2007 | Ruppi | 427/255.391 |

FOREIGN PATENT DOCUMENTS

| | | |
|---|---|---|
| JP | 50-14237 B | 5/1975 |
| JP | 06-008010 A | 1/1994 |
| JP | 2004-100004 A | 4/2004 |
| JP | 2005-238437 A | 9/2005 |
| JP | 2007-260786 A | 10/2007 |
| JP | 2007-260851 A | 10/2007 |
| JP | 2009-028861 A | 2/2009 |
| JP | 2009-178774 A | 8/2009 |

OTHER PUBLICATIONS

International Search Report dated Dec. 14, 2010, issued for PCT/JP2010/069420.

Chinese Office Action dated Sep. 3, 2013 for corresponding Chinese Patent Application No. 201080048312.X.

* cited by examiner

The number of grains in the first lower layer equals to 6,
and the number of grains in the first upper layer equals to 24.
b1/a1=4

The number of grains in the first lower layer equals to 9,
and the number of grains in the first upper layer equals to 20.
b1/a1=2.2

US 8,758,907 B2

SURFACE COATED CUTTING TOOL WITH EXCELLENT CHIPPING RESISTANCE

TECHNICAL FIELD

The present invention relates to a surface coated cutting tool (hereinafter referred to as a coated tool) in which a hard coating layer has excellent interlayer adhesion strength, and therefore chipping (fine fracturing) does not occur at cutting edges, and excellent cutting performance is exhibited over a long period of use even in a case where, for example, a work piece, such as steel or cast iron, is cut under high-speed intermittent cutting conditions in which high temperatures are generated, and, particularly, intermittent load is applied to the cutting edges.

Priority is claimed on Japanese Patent Application No. 2009-250199, filed Oct. 30, 2009, Japanese Patent Application No. 2010-65527, filed Mar. 23, 2010, Japanese Patent Application No. 2010-226353, filed Oct. 6, 2010, and Japanese Patent Application No. 2010-226354, filed Oct. 6, 2010, the content of which is incorporated herein by reference.

BACKGROUND ART

Conventionally, a coated tool having a hard coating layer composed of the following lower layer (a) and upper layer (b) formed by deposition on the surface of a tungsten carbide-based cemented carbide substrate (hereinafter referred to as a carbide substrate) or a TiCN-based cermet substrate (hereinafter referred to as a cermet substrate; in addition, an carbide substrate and a cermet substrate will be collectively referred to as a cutting tool body) has been widely known (for example, Patent Document 1).

(a) The lower layer: a Ti compound layer composed of one or more layers of a TiC layer, a TiN layer, a TiCN layer, a TiCO layer, and a TiCNO layer having an average overall layer thickness of 3 μm to 20 μm.

(b) The upper layer: an aluminum oxide (hereinafter expressed as $Al_2O_3$) layer having an average layer thickness of 1 μm to 15 μm and an α-type crystalline structure of a state formed by chemical vapor deposition.

This coated tool is known to exhibit excellent wear resistance in a cutting process of steel, cast iron, and the like.

In addition, a coated tool in which the grain width of a TiCN layer composing a lower layer of a hard coating layer is set to 0.01 μm to 0.5 μm in order to improve the fracture resistance, impact resistance, wear resistance, and the like of the coated tool is known (for example, Patent Literature 2).

RELATED ART LITERATURE

Patent Literature

Patent Literature 1: Japanese Examined Patent Application, Second Publication No. S50-14237
Patent Literature 2: Japanese Unexamined Patent Application, First Publication No. 2007-260851

DISCLOSURE OF INVENTION

Problems to be Solved

Recently, there has been a strong demand for power saving and energy saving in cutting processes. Accordingly, cutting processes have tended to become faster and more efficient. On the other hand, there is another demand for increasing the thickness of a hard coating layer to extend the tool life.

However, when a high-speed intermittent cutting process of steel or cast iron is carried out using a coating tool of the related art in which a hard coating layer composed of a Ti compound layer as a lower layer and an $Al_2O_3$ layer as an upper layer is formed, fine chipping, interlayer delamination, and the like occur in the hard coating layer. Because of this, the tool life of the cutting tool expires within a relatively short period of time.

Means to Solve the Problems

Therefore, the present inventors carried out thorough studies regarding the layer structure of a hard coating layer in order to improve the chipping resistance and delamination resistance of a coating tool, and, consequently, found the following.

In the hard coating layer of the coating tool, the lower layer composed of a Ti compound layer formed of one or more layers of a TiC layer, a TiN layer, a TiCN layer, a TiCO layer, and a TiCNO layer contributes to improving the high-temperature strength of the hard coating layer by the intrinsic excellent high-temperature strength thereof. The upper layer composed of an $Al_2O_3$ layer is excellent in terms of oxidation resistance and thermal stability, and further has high hardness. However, the adhesion strength between the lower layer and the upper layer is not sufficient in high-speed intermittent cutting in which high temperatures are generated, and high load is particularly intermittently applied to cutting edges, which may result in occurrence of fine chipping and interlayer delamination.

Therefore, as a result of repeating a number of tests regarding reforming of an adhesion interface area between the lower layer and the upper layer in order to increase the interface adhesion strength of both layers, it was found that the interface adhesion strength between the lower layer and the upper layer is increased by improving the crystal grain structure in the interface to which the lower layer and the upper layer are adjacent.

Specifically, the average grain diameter of crystal grains in the Ti compound layer immediately below the $Al_2O_3$ layer is set to 0.5 μm or less, and the lower and upper layers are vapor-deposited so that the ratio b1/a1 satisfies $4 \leq b1/a1 \leq 20$, when a1 is the number of the crystal grain (Ti compound) on the lower layer side touching the interface between the first lower layer and the first upper layer, and b1 is the number of the crystal grain ($Al_2O_3$) on the upper layer side touching the interface between the first lower layer and the first upper layer. Because of these, distortion occurring in the interface between the lower layer and the upper layer is alleviated. Consequently, the interlayer adhesion strength between the lower layer and the upper layer is increased.

In addition, as a result of repeating a number of additional tests regarding improvement in an adhesion interface area between the lower layer and the upper layer in order to increase the interface adhesion strength of both layers, it was found that, when a tool area is divided into three areas composed of a cutting edge portion 1, a flank portion 2, and a rake face portion 3, the interface adhesion strength is increased by improving the crystal grain structure in the interface to which the lower layer and the upper layer are adjacent at each of the areas.

Specifically, the average grain diameter of the Ti compound layer composing a second lower layer immediately below the $Al_2O_3$ layer is set to 0.1 μm or less, the second lower layer and the second upper layer are vapor-deposited on the cutting edge portion 1 so that the ratio b2/a2 satisfies $0.8 \leq b2/a2 \leq 1.2$, when a2 is the number of the crystal grain (Ti compound) on the second lower layer side toughing the interface between the second lower layer and the second upper layer, and b2 is the number of the crystal grain (Al2O3) on the second upper layer side touching the interface between the second lower layer and the second upper layer, and the first lower layer and the first upper layer are vapor-deposited on the flank face portion 2 and the rake portion 3 so that the ratio b1/a1 satisfies $4 \leq b1/a1 \leq 20$, when a1 is the number of the crystal grain (Ti compound) on the first lower layer side touching the interface between the first lower layer and the first upper layer, and b1 is the number of the crystal grain ($Al_2O_3$) on the first upper layer side touching the interface between the first lower layer and the first upper layer. Because of these, distortion occurring in the interface between the lower layer and the upper layer is alleviated across the entire tool area. Consequently, the interlayer adhesion strength between the lower and upper layers is increased.

Because of the above-mentioned testing results, it was found that excellent wear resistance can be exhibited over a long period of use without chipping and delamination even in high-speed intermittent cutting processes in which high temperatures are generated, and, particularly, intermittent load is intermittently applied to the cutting edges.

An first aspect of the present invention is a surface coated cutting tool including: a cutting tool body made of tungsten carbide-based cemented carbide or titanium carbide-based cermet; and a first hard coating layer vapor-deposited on at least a part of the surface of the cutting tool body, wherein the first hard coating layer includes a first lower layer vapor-deposited on the surface of the cutting tool body, and a first upper layer vapor-deposited on the surface of the lower layer, wherein the first lower layer includes one or more Ti compound layers selected from a group consisting of a Ti carbide layer, a Ti nitride layer, a Ti carbonitride layer, a Ti carboxide layer, and a Ti oxycarbonitride layer; the first upper layer includes an $Al_2O_3$ layer; a ratio of b1 to a1, which is b1/a1, satisfies the formula, $4 \leq b1/a1 \leq 20$, a1 being the number of crystal grains on the Ti compound layer side touching the interface between the first lower layer and the first upper layer, and b1 being the number of crystal grains on the $Al_2O_3$ layer side touching the interface between the first lower layer and the first upper layer; and an average diameter of crystal grains in the Ti compound layer directly below the $Al_2O_3$ layer of the first upper layer is 0.5 µm or less.

The surface coated cutting tool of the first aspect of the present invention may further includes: a second hard coating layer vapor-deposited on a surface of a cutting edge portion 1 of the cutting tool body, when a tool area is divided into three areas composed of the cutting edge portion 1, a flank face portion 2, and a rake face portion 3, wherein the second hard coating layer includes: a second lower layer vapor-deposited on the surface of the cutting edge portion 1 of the cutting tool body; and a second upper layer vapor-deposited on the surface of the second lower layer, wherein the second lower layer includes one or more Ti compound layers selected from a group consisting of a Ti carbide layer, a Ti nitride layer, a Ti carbonitride layer, a Ti carboxide layer, and a Ti oxycarbonitride layer; the second upper layer includes an $Al_2O_3$ layer with an α-type crystal structure; a ratio of b2 to a2, which is b2/a2, satisfies the formula, $0.8 \leq b2/a2 \leq 1$, a2 being the number of crystal grains on the Ti compound layer side touching the interface between the second lower layer and the second upper layer, and b2 being the number of crystal grains on the $Al_2O_3$ layer side touching the interface between the second lower layer and the second upper layer; an average diameter of crystal grains in the Ti compound layer directly below the $Al_2O_3$ layer of the second upper layer is 0.1 µm or less, and the flank face portion 2 and the rake face portion 3 are coated with the first hard coating layer.

In the surface coated cutting tool of the first aspect of the present invention, the average overall layer thickness of the first lower layer may be 3 µm to 20 µm, and the average layer thickness of the first upper layer may be 1 µm to 15 µm.

In the surface coated cutting tool of the first aspect of the present invention, the average overall layer thickness of the second lower layer may be 3 µm to 20 µm, and the average layer thickness of the second upper layer may be 1 µm to 15 µm.

In the surface coated cutting tool of the first aspect of the present invention, an average diameter of crystal grains in the Ti compound layer, which is included in the first lower layer and located directly below the $Al_2O_3$ layer of the first upper layer, may be 0.1 µm to 0.5 µm.

The first lower layer and the first upper layer included in the first hard coating layer of the first aspect of the present invention will be explained in detail below.

(a) First Lower Layer (Ti Compound Layer)

The first lower layer is a Ti compound layer including one more layers of a Ti carbide (TiC) layer, a Ti nitride (TiN) layer, a Ti carbonitride (TiCN) layer, a Ti carboxide (TiCO) layer, and a Ti oxycarbonitride (TiCNO) layer. The first lower layer is present as a lower layer of the first hard coating layer, and contributes to improving high-temperature strength of a hard coating layer by the intrinsic excellent high-temperature strength thereof. In a case in which the total average layer thickness of the first lower layer is less than 3 µm, the above-mentioned technical effect cannot be sufficiently exhibited. On the other hand, in a case in which the total average layer thickness exceeds 20 µm, thermal plastic deformation becomes liable to occur during particularly high-speed intermittent cutting in which high temperatures are generated, which may cause uneven wear. Therefore, the average layer thickness was specified as 3 µm to 20 µm. A more preferable average layer thickness of the first lower layer is 5 µm to 15 µm. An even more preferable average layer thickness of the first lower layer is 7 µm to 10 µm.

In the first lower layer, in a case in which the average grain diameter of the crystal grains in the Ti compound layer immediately below the upper layer ($Al_2O_3$ layer) exceeds 0.5 µm, the interlayer adhesion strength between the upper layer ($Al_2O_3$ layer) and the Ti compound layer immediately below the upper layer ($Al_2O_3$ layer) is weakened. As a result, the chipping resistance of the surface coated tool is deteriorated. Because of this, the average grain diameter of the crystal grains in the Ti compound layer immediately below the upper layer ($Al_2O_3$ layer) was specified as 0.5 µm or less. The more preferable average grain diameter of the crystal grains in the Ti compound layer immediately below the upper layer ($Al_2O_3$ layer) is 0.3 µm or less.

The average grain diameter is obtained by drawing a 50 µm-long line in the parallel direction to the surface of the carbide substrate on a cross section observed using a transmission electron microscope, counting the number of intersections with crystal grain boundaries of the crystal grains in the Ti compound layer immediately below the $Al_2O_3$ layer, and obtaining a grain diameter from the average of the segment lengths.

(b) First Upper Layer ($Al_2O_3$ Layer)

The first upper layer is an $Al_2O_3$ layer that is vapor-deposited on the surface of the first lower layer. The first upper layer has high-temperature hardness and excellent heat resistance, and contributes to maintaining wear resistance as a fundamental role in a high-speed intermittent cutting process in which high temperatures are generated.

On the surface of the first lower layer including a Ti compound layer, for example, a pretreatment for vapor-deposition of $Al_2O_3$ is carried out in the following order. And then, an $Al_2O_3$ layer is formed under ordinary conditions, whereby the $Al_2O_3$ layer which satisfies conditions specified in the first aspect of the invention can be formed.

The pretreatment for vapor-deposition of $Al_2O_3$ is composed of the following first to fourth steps.

[First Step]

The surface of the first lower layer is reformed under conditions described below.

Reaction gas (volume %): 0.5% to 2% of $AlCl_3$ with the remainder of Ar

Atmosphere pressure: 30 Torr to 100 Torr

Atmosphere temperature: 750° C. to 1000° C.

Treatment duration: 1 min to 3 min

[Second Step]

The gas in a furnace is purged using Ar for 1 minute to 3 minutes in a state in which the following conditions below are maintained.

Atmosphere pressure: 30 Torr to 100 Torr

Treatment temperature: 750° C. to 1000° C.

[Third Step]

An oxidization treatment is carried out under conditions shown below (the proportion of $CO_2$ in the reaction gas is gradually decreased as the time elapses).

Reaction gas (volume %): 1% to 10% of $CO_2$ with the remainder of Ar

Atmosphere pressure: 30 Torr to 100 Torr

Treatment temperature: 750° C. to 1000° C.

Treatment duration: 5 min to 20 min

[Fourth Step]

The gas in the furnace is purged using Ar for 1 minute to 3 minutes in a state in which the following conditions shown below are maintained.

Atmosphere pressure: 30 Torr to 100 Torr

Treatment temperature: 750° C. to 1000° C.

When the pretreatment for vapor-deposition of $Al_2O_3$ composed of the above-mentioned four steps is carried out, and then an $Al_2O_3$ layer is formed by an ordinary film-forming method, an $Al_2O_3$ layer which satisfies the conditions specified by the first aspect of the invention is vapor-deposited on the surface of the first lower layer. As a result, the first upper layer having an interfacial structure in which the value of $b1/a1$ is 4 or more and 20 or less can be vapor deposited, when $a1$ is the number of crystal grains on the first lower layer side touching the interface between the first lower layer and the first upper layer, $b1$ is the number of crystal grains on the $Al_2O_3$ layer side touching the interface between the first lower layer and the first upper layer in a cross-section vertical to the surface of the cutting tool body, and the ratio $b1$ to $a1$, which is $b1/a1$, is calculated.

The numbers of $a1$ and $b1$ can be obtained by counting Ti compound grains having the interface with an $Al_2O_3$ grain, and $Al_2O_3$ grains having the interface with a Ti compound grain as explained below. First, a cross section of the cutting tool is observed by performing a dark-field observation with a magnification of 50000 times at 10 points on the interface between the first lower layer and the first upper layer using a transmission electron microscope. Then, a 25 μm straight-line parallel to the surface of the carbide substrate is defined as the measurement width. At the 10 points, the 25 μm straight-lines are placed and the numbers of the Ti compound grains having the interface with an $Al_2O_3$ grain, and the numbers of $Al_2O_3$ grains having the interface with a Ti compound grain are counted in the measurement width.

In a case in which the value $b1/a1$ of the ratio of $b1$ to $a1$ is 4 or less, it becomes impossible to sufficiently alleviate misfit in the interface between the first lower layer and the first upper layer. On the other hand, when $b1/a1$ exceeds 20, the intergrain stress in $Al_2O_3$ is increased, and excellent interlayer adhesion strength cannot be exhibited. Because of these, $b1/a1$ was specified as $4 \leq b1/a1 \leq 20$.

In the first hard coating layer of the first aspect of the present invention which includes the first upper layer and the first lower layer having the above interface configuration, interface distortion is alleviated, and therefore excellent interlayer adhesion strength is provided. As a result, in the surface coated cutting tool of the first aspect of the invention, occurrence of fine chipping and occurrence of delamination are suppressed in a high-speed intermittent cutting process.

In a case in which the average layer thickness of the first upper layer is less than 1 μm, wear resistance cannot be sufficiently exhibited over a long period of use, and the tool life is shortened. On the other hand, when the average layer thickness of the first upper layer exceeds 15 μm, chipping, fracturing, delamination, and the like are liable to occur at the cutting edge portion 1. Because of these, the average layer thickness of the first upper layer was specified as 1 μm to 15 μm. A more preferable average layer thickness of the first upper layer is 3 μm to 12 μm. An even more preferable average layer thickness of the first upper layer is 5 μm to 10 μm.

The second lower layer and the second upper layer included in the second hard coating layer of a second aspect of the present invention will be described in detail below.

(a) Second Lower Layer (Ti Compound Layer)

The second lower layer is a Ti compound layer including one or more layers of a Ti carbide (TiC) layer, a Ti nitride (TiN) layer, a Ti carbonitride (TiCN) layer, a Ti carboxide (TiCO) layer, and a Ti oxycarbonitride (TiCNO) layer. The second lower layer is present as a lower layer of the second hard coating layer, and contributes to improving high-temperature strength of a hard coating layer by the intrinsic excellent high-temperature strength thereof. In a case in which the total average layer thickness of the second lower layer is less than 3 μm, the above-mentioned technical effect cannot be sufficiently exhibited. On the other hand, in a case in which the total average layer thickness exceeds 20 μm, thermal plastic deformation becomes liable to occur during particularly high-speed intermittent cutting in which high temperatures are generated, which may cause uneven wear. Therefore, the average layer thickness was specified as 3 μm to 20 μm. A more preferable average layer thickness of the second lower layer is 5 μm to 15 μm. An even more preferable average layer thickness of the second lower layer is 7 μm to 10 μm.

In the cutting edge portion 1 having the second hard coating layer, when the average grain diameter of the Ti compound layer immediately below the $Al_2O_3$ layer exceeds 0.1 μm, the interlayer adhesion strength between the upper layer ($Al_2O_3$ layer) and the Ti compound layer immediately below the upper layer ($Al_2O_3$ layer) is weakened, and chipping resistance is deteriorated. Because of these, the average grain diameter in the Ti compound layer immediately below the $Al_2O_3$ layer was specified as 0.1 μm or less in the second hard coating layer. In contrast to the cutting edge portion, the flank portion 2 and the cutting portion 3 may be coated with the first hard coating layer. In this case, when the average grain diameter in the Ti compound layer immediately below the $Al_2O_3$ layer exceeds 0.5 μm in the flank portion 2 and the cutting portion 3, the interlayer adhesion strength between the upper layer ($Al_2O_3$ layer) and the Ti compound layer immediately below the upper layer ($Al_2O_3$ layer) is weakened, and chipping resistance is deteriorated. On the other hand, when the average grain diameter in the Ti compound layer immediately below the $Al_2O_3$ layer is smaller than 0.1 μm, the crystal grains are coarsened, the high-temperature strength is degraded, and the fracture resistance, impact resistance, and wear resistance are degraded. Therefore, the average grain diameter in the Ti compound layer immediately below the $Al_2O_3$ layer is preferably 0.1 μm to 0.5 μm.

Here, in order to obtain the cutting edge portion 1, the flank portion 2, and the cutting portion 3 configured within the parameters described above, on the cutting tool body, portions other than the cutting edge portion 1 were covered with a hard urethane rubber or the like, a wet blast treatment was carried out only on the cutting edge portion 1, and the surface roughness Ra of the cutting edge portion 1 was set to 0.2 μm or less on the cutting tool body. As a processing condition of the wet blast treatment, a polishing solution obtained by mixing 15% by mass to 60% by mass of aluminum oxide fine grains with respect to the total amount with water is sprayed as a spraying polishing solution.

(b) Second Upper Layer ($Al_2O_3$ Layer)

The second upper layer is an $Al_2O_3$ layer that is vapor-deposited on the surface of the second lower layer. The second upper layer has high-temperature hardness and excellent heat resistance, and contributes to maintaining wear resistance as a fundamental role in a high-speed cutting process in which high load is intermittently exerted to the cutting edge.

On the surface of the second lower layer including a Ti compound layer, for example, a pretreatment for deposition of $Al_2O_3$ is carried out in the following order. And then, an $Al_2O_3$ layer is formed under ordinary conditions, whereby the $Al_2O_3$ layer which satisfies conditions specified in the second aspect of the invention can be formed.

The pretreatment for vapor-deposition of $Al_2O_3$ is composed of the following first to fourth steps.

[First Step]

The surface of the second lower layer is reformed under conditions described below.

Reaction gas (volume %): 0.5% to 2% of $AlCl_3$ with the remainder of Ar
Atmosphere pressure: 30 Torr to 100 Torr
Atmosphere temperature: 750° C. to 1000° C.
Treatment duration: 1 min to 3 min

[Second Step]

The gas in a furnace is purged using Ar for 1 minute to 3 minutes in a state in which the following conditions below are maintained.

Atmosphere pressure: 30 Torr to 100 Torr
Treatment temperature: 750° C. to 1000° C.

[Third Step]

An oxidization treatment is carried out under conditions shown below (the proportion of $CO_2$ in the reaction gas is gradually decreased as the time elapses).

Reaction gas (volume %): 1% to 10% of $CO_2$ with the remainder of Ar
Atmosphere pressure: 30 Torr to 100 Torr
Treatment temperature: 750° C. to 1000° C.
Treatment duration: 5 min to 20 min

[Fourth Step]

The gas in the furnace is purged using Ar for 1 minute to 3 minutes in a state in which the following conditions shown below are maintained.

Atmosphere pressure: 30 Torr to 100 Torr
Treatment temperature: 750° C. to 1000° C.

When the pretreatment for deposition of $Al_2O_3$ composed of the afore-mentioned four steps is carried out, and then an $Al_2O_3$ layer is formed by an ordinary film-forming method, an $Al_2O_3$ layer which satisfies the conditions specified by the second aspect of the invention is deposited on the surface of the second lower layer. As a result, the second hard coating layer having an interfacial structure in which the value of b2/a2 is 0.8 or more and 1.2 or less can be vapor deposited on the cutting edge portion 1, when a2 is the number of crystal grains on the second lower layer side touching the interface between the second lower layer and the second upper layer, b2 is the number of crystal grains on the $Al_2O_3$ layer side touching the interface between the second lower layer and the second upper layer in a cross-section vertical to the surface of the cutting tool body, and the ratio b2 to a2, which is b2/a2, is calculated.

In a case in which the value b2/a2 of the ratio of b2 to a2 is 0.8 or less, it becomes impossible to sufficiently alleviate misfit in the interface between the first lower layer and the first upper layer in the cutting edge portion 1. On the other hand, when b2/a2 exceeds 1.2, the inter-grain stress in $Al_2O_3$ is increased, and excellent interlayer adhesion strength cannot be exhibited. Because of these, b2/a2 was specified as $0.8 \leq b2/a2 \leq 1.2$.

The numbers of a2 and b2 can be obtained by counting Ti compound grains having the interface with an $Al_2O_3$ grain, and $Al_2O_3$ grains having the interface with a Ti compound grain as explained below. First, a cross section of the cutting tool is observed by performing a dark-field observation with a magnification of 50000 times at 10 points on the interface between the second lower layer and the second upper layer using a transmission electron microscope. Then, a 25 μm straight-line parallel to the surface of the carbide substrate is defined as the measurement width. At the 10 points, the 25 μm straight-lines are placed and the numbers of the Ti compound grains having the interface with an $Al_2O_3$ grain, and the numbers of $Al_2O_3$ grains having the interface with a Ti compound grain are counted in the measurement width.

In the second hard coating layer of the second aspect of the present invention which includes the second upper layer and the second lower layer having the above interface configuration, interface distortion is alleviated, and therefore excellent interlayer adhesion strength is provided. As a result, in the surface coated cutting tool of the second aspect of the invention, occurrence of fine chipping and occurrence of delamination are suppressed in a high-speed intermittent cutting process.

In a case in which the average layer thickness of the second upper layer is less than 1 μm, wear resistance cannot be sufficiently exhibited over a long period of use, and the tool life is shortened. On the other hand, when the average layer thickness of the second upper layer exceeds 15 μm, chipping, fracturing, delamination, and the like are liable to occur at the cutting edge portion 1. Because of these, the average layer thickness of the second upper layer was specified as 1 μm to 15 μm. A more preferable average layer thickness of the second upper layer is 3 μm to 12 μm. An even more preferable average layer thickness of the second upper layer is 5 μm to 10 μm.

Advantageous Effects of Invention

The coated tool of the first aspect of the present invention is a cutting tool, which has the vapor-deposited first lower layer including a Ti compound layer and the vapor-deposited first upper layer including $Al_2O_3$ layer, as the hard coating layer. The interface structure is configured so that b1/a1 satisfies $4 \leq b1/a1 \leq 20$. $b1/a1$ is the ratio of $b1$ to $a1$. The value of $a1$ is the number of Ti compound crystal grains on the first lower layer side touching the interface between the first lower layer and the first upper layer. The value of $b1$ is the number of $Al_2O_3$ crystal grains on the first upper layer side touching the interface between the first lower layer and the first upper layer. Furthermore, the average grain diameter of crystal grains in the Ti compound layer immediately below the first upper layer ($Al_2O_3$ layer) is set to 0.5 μm or less.

By having the configurations explained above, the interlayer adhesion strength between the first lower layer and the first upper layer can be particularly increased. As a result, even in a case in which the coated tool is used in a high-speed intermittent cutting process in which high temperatures are generated, and high load is applied on the cutting edge, for example, a high-speed intermittent cutting process on steel, cast iron, or the like, the hard coating layer has excellent interlayer adhesion strength, and therefore occurrence of fine chipping, delamination, and the like at cutting edges is reduced. Thereby, the coated tool of the first aspect of the present invention exhibits excellent wear resistance over a long period of use.

The coated tool of the second aspect of the invention is a tool further having the second hard layer in addition to the first hard coating layer. The second hard layer has the vapor-deposited second lower layer including an Ti compound layer and the vapor-deposited second upper layer including $Al_2O_3$ layer.

In a cutting edge portion 1, the interface structure is configured so that $b2/a2$ satisfied $0.8 \leq b2/a2 \leq 1.2$. The value of $a2$ is the number of Ti compound crystal grains on the second lower layer side touching the interface between the second lower layer and the second upper layer. The value of $b2$ is the number of $Al_2O_3$ crystal grains on the second upper layer side touching the interface between the second lower layer and the second upper layer. Furthermore, the average grain diameter of crystal grains in the Ti compound layer immediately below the $Al_2O_3$ layer is set to 0.1 μm or less.

In the flank face portion 2 and the rake face portion 3, the interface structure is configured so that $b1/a1$ satisfies $4 \leq b1/a1 \leq 20$. $b1/a1$ is the ratio of $b1$ to $a1$. The value of $a1$ is the number of Ti compound crystal grains on the first lower layer side touching the interface between the first lower layer and the first upper layer. The value of $b1$ is the number of $Al_2O_3$ crystal grains on the first upper layer side touching the interface between the first lower layer and the first upper layer. Furthermore, the average grain diameter of crystal grains in the Ti compound layer immediately below the first upper layer ($Al_2O_3$ layer) is set to 0.1 μm to 0.5 μm.

By having the configurations explained above, the interlayer adhesion strength between the first lower layer and the first upper layer can be particularly increased. As a result, even in a case in which the coated tool is used in a high-speed intermittent cutting process in which high temperatures are generated, and high load is intermittently applied to the cutting edge portion 1, for example, a high-speed intermittent cutting process on steel, cast iron, or the like, the hard coating layer has excellent interlayer adhesion strength, and therefore occurrence of fine chipping, delamination, and the like at the cutting edge portion 1 is reduced. Thereby, the coated tool of the second aspect of the invention can exhibits excellent wear resistance over a long period of use.

BEST MODE FOR CARRYING OUT THE INVENTION

Figure 1:
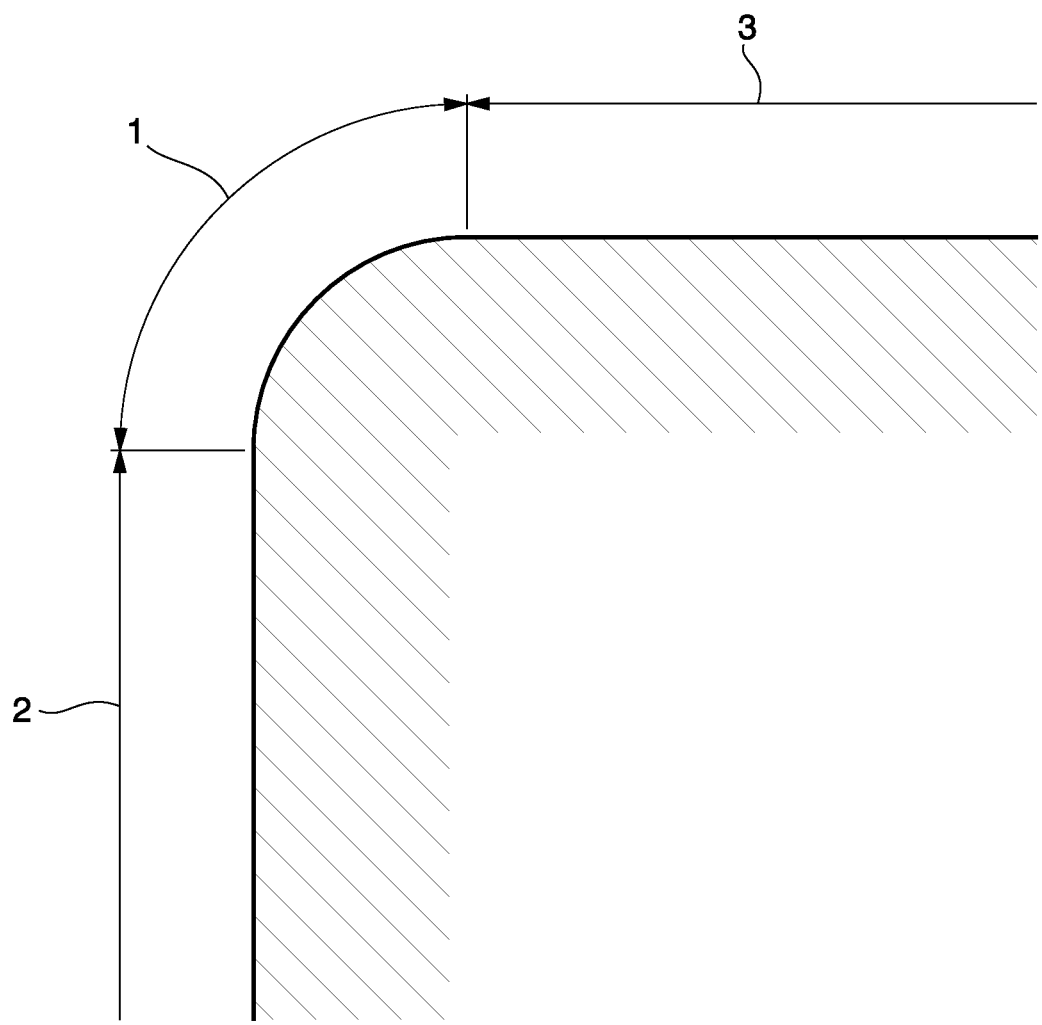
FIG. 1 is a cross-sectional view of a cutting tool when being cut at a right angle to the ridge line of a cutting edge, and shows areas corresponding to the flank face, the cutting edge portion 1, and the rake face on the surface of the cutting tool.

Next, the coated tool of the present invention will be specifically explained using Example 1 and Example 2.

Example 1

As raw material powder of a cutting tool body made of a WC-based cemented carbide, WC powder, TiC powder, ZrC powder, VC powder, TaC powder, NbC powder, $Cr_3C_2$ powder, TiN powder, TaN powder, and Co powder, all of which had an average grain diameter of 2 μm to 4 μm, were prepared, and the raw material powder was mixed into the mixture compositions as shown in Table 1. Next, wax was added to the mixture, mixed in acetone for 24 hours using a ball mill, dried under reduced pressure, and then pressed into a green compact having a predetermined shape at a pressure of 98 MPa. Next, the green compact was vacuum-sintered under conditions in which the green compact was held at a predetermined temperature in a range of 1370° C. to 1470° C. under a vacuum of 5 Pa for 1 hour. After the sintering, a honing process with R: 0.07 mm was carried out on the cutting edge portion, and cutting tool bodies 1A to 1F made of a WC-based cemented carbide having an insert shape, which is defined in ISO CNMG 160412, were manufactured.

As raw material powder of a cutting tool body made of a TiCN-based cermet, TiCN (TiC/TiN=50/50 by the mass ratio) powder, $Mo_2C$ powder, ZrC powder, NbC powder, TaC powder, WC powder, Co powder, and Ni powder, all of which had an average grain diameter of 0.5 μm to 2 μm, were used. Next, the raw material powder was mixed into the mixture compositions as shown in Table 2, wet-mixed for 24 hours using a ball mill, dried, and then pressed into a green compact at a pressure of 98 MPa. Next, the green compact was held in a nitrogen atmosphere of 1.3 kPa under conditions of a temperature of 1540° C. for 1 hour, and sintered. After the sintering, a honing process with R: 0.07 mm was carried out on the cutting edge portion, and cutting tool bodies 1a to 1f made of a TiCN-based cermet having an insert shape, which is defined in ISO CNMG 160412, were formed.

Next, each of the cutting tool bodies 1A to 1F and the cutting tool bodies 1a to 1f was placed in an ordinary chemical vapor deposition apparatus, and Ti compound layers having the combinations and the target layer thicknesses as shown in Table 6 were formed by vapor-deposition as the first lower layer of the first hard coating layer under conditions as shown in Table 3 (1-TiCN in Table 3 represents forming conditions of a TiCN layer having the columnar crystal structure as described in JP-A-H6-8010, and the others represent forming conditions of an ordinary granular crystal structure).

Next, a pretreatment for vapor-deposition of $Al_2O_3$ was carried out on the surface of the first lower layer under conditions as shown in Table 4.

Next, $Al_2O_3$ layers were vapor-deposited as the first upper layer to produce the surface coated tools A1 to A13 of the present invention. The condition for the vapor-deposition is shown in Table 3. Combinations of cutting tool bodies, the lower layer and the upper layer are shown in Table 5. The target layer thickness of the upper layer is shown in Table 5.

For a comparison purpose, the conventional surface coated tools A1 to A13 shown in Table 6 were also manufactured. The conventional surface coated tools A1 to A13 were produced in the same way to the surface coated tools A1 to A13 of the present invention by vapor-depositing the first lower layer (Ti compound layer) and the first upper layer ($Al_2O_3$ layer), except for not performing the pretreatment prior to $Al_2O_3$ vapor-deposition on the surface of the lower layer.

Next, cross sections were measured through dark-field observation using a transmission electron microscope (50000 times) at 10 points near the interface between the lower layer and the upper layer in the first hard coating layer of each of the coated tools A1 to A13 of the present invention and the conventional coated tools A1 to A13. A 25 μm straight-line parallel to the surface of the carbide substrate was defined as the measurement width. At the 10 points, the 25 μm straight-lines were placed and the numbers of the Ti compound grains having the interface with an $Al_2O_3$ grain, and the numbers of $Al_2O_3$ grains having the interface with a Ti compound grain were counted in the measurement width. Values of b1/a1 were obtained from a1 and b1 obtained in the above manner.

Table 5 shows a1 and b1 obtained by the above measurement, and the values of b1/a1 obtained therefrom.

Figure 2:
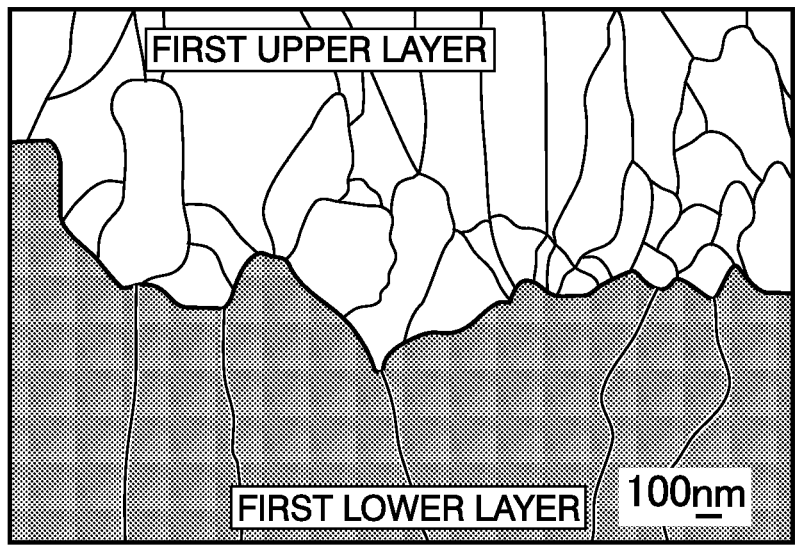
FIG. 2 is a schematic view of an interface structure of an interface between the first lower layer and the first upper layer of the coated tool A6 of the present invention. The schematic view was created based on a transmission electron microscopic photograph. The values of a1, b1, and b1/a1 are also shown.

FIG. 2 shows a schematic view of an interface structure of the interface between the first lower layer and the first upper layer of the surface coated tool A6 of the present invention. The schematic view was prepared based on a transmission electron microscopic photograph, and values of a1, b1, and b1/a1.

Figure 3:
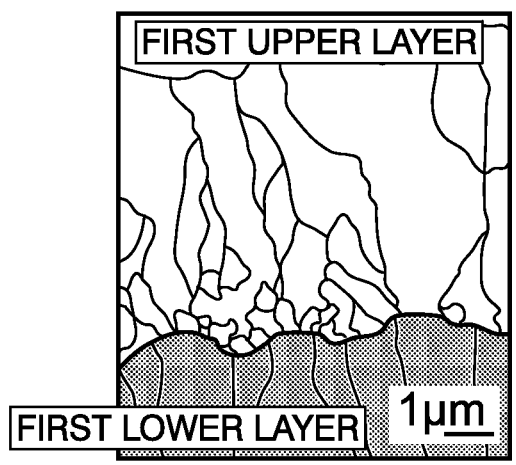
FIG. 3 is a schematic view of an interface structure of an interface between the first lower layer and the first upper layer of the conventional coated tool A8. The schematic view was created based on a transmission electron microscopic photograph. The values of a1, b1, and b1/a1 are also shown.

FIG. 3 shows a schematic view of an interface structure of the interface between the first lower layer and the first upper layer of the conventional surface coated tool A8. The schematic view was prepared using a transmission electron microscopic photograph, and values of a1, b1, and b1/a1.

Regarding the Ti compound in the lower layers in the hard coating layers of the surface coated tools A1 to A13 of the present invention and the conventional surface coated tools A1 to A13, a 50 μm-long line was drawn in the parallel direction to the surface of the carbide substrate on a cross section observed using a transmission electron microscope. Then, the number of intersections with crystal grain boundaries of the crystal grains in the Ti compound layer immediately below the upper layer ($Al_2O_3$ layer) was counted, and the average grain diameter was obtained from the average intervals of the segments.

Table 5 shows the measured average grain diameters.

Furthermore, the thicknesses of component layers of the hard coating layers of the surface coated tools A1 to A13 of the present invention and the conventional surface coated tools A1 to A13 were measured (vertical cross section measurement) using a scanning electron microscope. Based on the results, all the thicknesses of the component layers of the hard coating layers had the average layer thickness (average value of 5-point-measurement), which was substantially the same as the target layer thickness.

Next, dry high-speed intermittent cutting tests of carbon steel were carried out on the surface coated tools A1 to A13 of the present invention and the conventional surface coated tools A1 to A13 under three conditions as shown below. All the tests were carried out in a state in which the coated tools were screw-fastened to the front end portion of a tool steel bite using fixing jigs.

[Cutting Condition 1A]

A dry high-speed intermittent cutting test (an ordinary cutting speed is 200 m/min.) of nickel chrome molybdenum steel was carried out under conditions below.

Work piece: a round rod of JIS-SNCM 420 having 4 vertical grooves at equal intervals in the length direction
Cutting speed: 375 m/min
Cutting depth: 2.4 mm
Feeding: 0.22 mm/rev
Cutting time: 5 minutes

[Cutting Condition 1B]

A dry high-speed intermittent cutting test (an ordinary cutting speed is 180 m/min.) of cast iron was carried out under conditions below.

Work piece: a round rod of JIS-FCD 500 having 4 vertical grooves at equal intervals in the length direction
Cutting speed: 365 m/min
Cutting depth: 2.45 mm
Feeding: 0.31 mm/rev
Cutting time: 5 minutes

[Cutting Condition 1C]

A dry high-speed intermittent cutting test (an ordinary cutting speed is 250 m/min.) of carbon steel was carried out under conditions below.

Work piece: a round rod of JIS-S30C having 4 vertical grooves at equal intervals in the length direction
Cutting speed: 370 m/min
Cutting depth: 1.55 mm
Feeding: 0.47 mm/rev
Cutting time: 5 minutes In all of the cutting tests, abrasion widths on the flank face at the cutting edge were measured.

The measurement results are shown in Table 7.

TABLE 1

| Type | | Co | TiC | ZrC | VC | TaC | NbC | Cr₃C₂ | TiN | TaN | WC |
|---|---|---|---|---|---|---|---|---|---|---|---|
| Cutting tool body | 1A | 7 | — | — | — | — | — | — | — | — | Remainder |
| | 1B | 5.7 | — | — | — | 1.5 | 0.5 | — | 1.2 | — | Remainder |
| | 1C | 5.7 | 2.3 | — | — | — | — | 1 | — | — | Remainder |
| | 1D | 8.5 | — | 0.5 | — | — | — | 0.5 | — | — | Remainder |
| | 1E | 12.5 | 2 | — | — | — | — | — | 1 | 2 | Remainder |
| | 1F | 9.8 | — | — | 0.2 | — | 4 | 0.8 | — | — | Remainder |

TABLE 2

| Type | | Co | Ni | ZrC | TaC | NbC | Mo₂C | WC | TiCN |
|---|---|---|---|---|---|---|---|---|---|
| Cutting tool body | 1a | 12 | 6 | — | 10 | — | 10 | 16 | Remainder |
| | 1b | 7 | 7 | — | 5 | — | 7.5 | — | Remainder |
| | 1c | 5 | — | — | — | 1 | 6 | 10 | Remainder |
| | 1d | 9 | 6 | — | 11 | 2 | — | — | Remainder |
| | 1e | 8 | 5 | 1 | 8 | — | 10 | 10 | Remainder |
| | 1f | 11 | 6.5 | — | 10 | — | 9.5 | 14.5 | Remainder |

TABLE 3

| | Hard coating layer | | Forming conditions (the pressure and temperature of the reaction atmosphere are expressed in kPa and °C., respectively) | | |
|---|---|---|---|---|---|
| | | Composition (numbers | | Reaction atmosphere | |
| Type | | represent atomic ratios) | Reaction gas composition (volume %) | Pressure | Temperature |
| TiC layer | | TiC | TiCl₄: 4.2%, CH₄: 8.5%, H₂: remainder | 7 | 1020 |
| TiN layer (first layer) | | TiN | TiCl₄: 4.2%, N₂: 30%, H₂: remainder | 30 | 900 |
| TiN layer (other layers) | | TiN | TiCl₄: 4.2%, N₂: 35%, H₂: remainder | 50 | 1040 |
| 1-TiC₀.₅N₀.₅ layer | | TiC$_{0.5}$N$_{0.5}$ | TiCl₄: 4.2%, N₂: 20%, CH₃CN: 0.6%, H₂: remainder | 7 | 900 |
| TiCN layer | | TiC$_{0.5}$N$_{0.5}$ | TiCl₄: 4.2%, N₂: 20%, CH₄: 4%, H₂: remainder | 12 | 1020 |
| TiCO layer | | TiC$_{0.5}$O$_{0.5}$ | TiCl₄: 4.2%, CO: 4%, H₂: remainder | 7 | 1020 |
| TiCNO layer | | TiC$_{0.3}$N$_{0.3}$O$_{0.4}$ | TiCl₄: 4.2%, CO: 3%, CH₄: 3%, N₂: 20%, H₂: remainder | 20 | 1020 |
| Al₂O₃ layer | | — | AlCl₃: 3%, CO₂: 6%, HCl: 8%, H₂S: 0.4%, H₂: remainder | 7 | 1000 |

TABLE 4

| | | Pretreatment symbols for vapor-deposition of Al₂O₃ | | | |
|---|---|---|---|---|---|
| Pretreatment conditions | | 1A | 1B | 1C | 1D |
| First step | Reaction gas (volume %) | AlCl₃: 1%, Ar: remainder | AlCl₃: 0.5%, Ar: remainder | AlCl₃: 2%, Ar: remainder | AlCl₃: 1.5%, Ar: remainder |
| | Atmosphere pressure (Torr) | 50 | 100 | 30 | 75 |
| | Treatment temperature (°C.) | 1000 | 800 | 750 | 900 |
| | Treatment duration (min.) | 2 | 3 | 1 | 2 |
| Second step | Reaction gas (volume %) | Ar | Ar | Ar | Ar |
| | Atmosphere pressure (Torr) | 50 | 100 | 30 | 75 |
| | Treatment temperature (°C.) | 1000 | 750 | 800 | 900 |
| | Treatment duration (min.) | 2 | 3 | 1 | 2 |
| Third step | Reaction gas (volume %) | CO₂: 5→1%, Ar: remainder | CO₂: 10→1%, Ar: remainder | CO₂: 3→1%, Ar: remainder | CO₂: 8→4%, Ar: remainder |
| | Atmosphere pressure (Torr) | 50 | 100 | 30 | 75 |
| | Treatment temperature (°C.) | 1000 | 750 | 800 | 900 |
| | Treatment duration (min.) | 10 | 5 | 20 | 15 |

TABLE 4-continued

|  | | Pretreatment symbols for vapor-deposition of $Al_2O_3$ | | | |
|---|---|---|---|---|---|
| Pretreatment conditions | | 1A | 1B | 1C | 1D |
| Fourth step | Reaction gas (volume %) | Ar | Ar | Ar | Ar |
| | Atmosphere pressure (Torr) | 50 | 100 | 75 | 30 |
| | Treatment temperature (° C.) | 1000 | 750 | 900 | 800 |
| | Treatment duration (min.) | 2 | 3 | 1 | 2 |

TABLE 5

| | | | Hard coating layer | | | | | | | | |
|---|---|---|---|---|---|---|---|---|---|---|---|
| | | | Lower layer | | | | | Upper layer | | Interface between lower layer and upper layer | | |
| | | | | | | | Average grain diameter of crystal grains immediately below upper layer (µm) | Target layer thickness (µm) | Pre-treatment symbol | | | |
| Type | | Cutting tool body symbol | First layer (µm) | Second layer (µm) | Third layer (µm) | Fourth layer (µm) | | | | a1 value | b1 value | b1/a1 value |
| Surface coated tool of the present invention | A1 | 1a | TiN (1) | l-TiCN (17.5) | TiN (1) | TiCNO (0.5) | 0.35 | 7 | 1A | 63 | 948 | 15 |
| | A2 | 1A | TiCN (1) | l-TiCN (8.5) | TiCO (0.5) | — | 0.38 | 7 | 1A | 58 | 810 | 14 |
| | A3 | 1b | TiN (1) | l-TiCN (4) | TiC (4) | TiCNO (1) | 0.32 | 1 | 1C | 68 | 477 | 7 |
| | A4 | 1B | TiC (1) | l-TiCN (9) | — | — | 0.5 | 10 | 1B | 50 | 515 | 10 |
| | A5 | 1c | TiN (1) | l-TiCN (4.5) | TiCNO (0.5) | — | 0.28 | 5 | 1D | 78 | 482 | 6 |
| | A6 | 1C | TiN (0.5) | l-TiCN (1.5) | TiC (0.5) | TiCNO (0.5) | 0.21 | 15 | 1D | 100 | 400 | 4 |
| | A7 | 1d | TiN (0.5) | l-TiCN (10) | TiC (2) | TiCNO (0.3) | 0.4 | 8 | 1B | 57 | 699 | 12 |
| | A8 | 1D | TiN (1) | TiCN (19) | — | — | 0.45 | 3 | 1C | 72 | 751 | 10 |
| | A9 | 1e | TiC (0.5) | TiCN (9) | TiCO (0.5) | — | 0.27 | 3 | 1C | 83 | 465 | 6 |
| | A10 | 1E | TiN (1) | TiC (1) | TiCN (7) | TiCO (1) | 0.33 | 10 | 1B | 66 | 884 | 13 |
| | A11 | 1f | TiN (1) | TiC (1) | l-TiCN (8) | — | 0.39 | 12 | 1A | 57 | 1140 | 20 |
| | A12 | 1F | TiC (1) | l-TiCN (4) | TiCNO (1) | — | 0.41 | 9 | 1D | 56 | 311 | 6 |
| | A13 | 1D | TiCN (0.5) | TiC (2) | TiCNO (0.5) | — | 0.32 | 12 | 1A | 64 | 1052 | 16 |

(The numbers in the parentheses in the lower layer column are target layer thicknesses.)

TABLE 6

| Type | | Cutting tool body symbol | Hard coating layer | | | | | | | a1 value | b1 value | b1/a1 value |
|---|---|---|---|---|---|---|---|---|---|---|---|---|
| | | | Lower layer | | | | | Upper layer | | Interface between lower layer and upper layer | | |
| | | | First layer (μm) | Second layer (μm) | Third layer (μm) | Fourth layer (μm) | Average grain diameter of crystal grains immediately below upper layer (μm) | Target layer thickness (μm) | Pre-treatment symbol | | | |
| Conventional surface coated tool | A1 | | Same as the surface coated tool A1 of the present invetion | | | | | | — | 66 | 220 | 3 |
| | A2 | | Same as the surface coated tool A2 of the present invetion | | | | | | — | 54 | 171 | 3 |
| | A3 | | Same as the surface coated tool A3 of the present invetion | | | | | | — | 64 | 144 | 2 |
| | A4 | | Same as the surface coated tool A4 of the present invetion | | | | | | — | 53 | 155 | 3 |
| | A5 | | Same as the surface coated tool A5 of the present invetion | | | | | | — | 81 | 156 | 2 |
| | A6 | | Same as the surface coated tool A6 of the present invetion | | | | | | — | 110 | 94 | 1 |
| | A7 | | Same as the surface coated tool A7 of the present invetion | | | | | | — | 64 | 184 | 3 |
| | A8 | | Same as the surface coated tool A8 of the present invetion | | | | | | — | 71 | 155 | 2 |
| | A9 | | Same as the surface coated tool A9 of the present invetion | | | | | | — | 80 | 171 | 2 |
| | A10 | | Same as the surface coated tool A10 of the present invetion | | | | | | — | 65 | 69 | 1 |
| | A11 | | Same as the surface coated tool A11 of the present invetion | | | | | | — | 58 | 123 | 2 |
| | A12 | | Same as the surface coated tool A12 of the present invetion | | | | | | — | 62 | 188 | 3 |
| | A13 | | Same as the surface coated tool A13 of the present invetion | | | | | | — | 71 | 119 | 2 |

TABLE 7

| Type | | Flank wear width (mm) | | | Type | | Cutting test results (minutes) | | |
|---|---|---|---|---|---|---|---|---|---|
| | | Cutting conditions (1A) | Cutting conditions (1B) | Cutting conditions (1C) | | | Cutting conditions (1A) | Cutting conditions (1B) | Cutting conditions (1C) |
| Surface coated tool of the present invention | A1 | 0.12 | 0.14 | 0.11 | Conventional surface coated tool | A1 | 2.7 | 2.5 | 2.8 |
| | A2 | 0.13 | 0.13 | 0.12 | | A2 | 2.5 | 2.3 | 2.5 |
| | A3 | 0.22 | 0.23 | 0.22 | | A3 | 1.7 | 1.5 | 1.7 |
| | A4 | 0.15 | 0.15 | 0.14 | | A4 | 2.2 | 2.1 | 2.1 |
| | A5 | 0.24 | 0.23 | 0.23 | | A5 | 1.6 | 1.6 | 1.5 |
| | A6 | 0.27 | 0.30 | 0.27 | | A6 | 1.3 | 1.1 | 1.2 |
| | A7 | 0.14 | 0.16 | 0.14 | | A7 | 2.4 | 2.4 | 2.2 |
| | A8 | 0.13 | 0.15 | 0.15 | | A8 | 2.3 | 2.1 | 2.0 |
| | A9 | 0.22 | 0.23 | 0.22 | | A9 | 1.9 | 1.8 | 1.9 |
| | A10 | 0.13 | 0.14 | 0.14 | | A10 | 2.5 | 2.4 | 2.4 |
| | A11 | 0.12 | 0.12 | 0.10 | | A11 | 2.7 | 2.8 | 2.8 |
| | A12 | 0.21 | 0.23 | 0.20 | | A12 | 1.5 | 1.4 | 1.5 |
| | A13 | 0.14 | 0.13 | 0.11 | | A13 | 2.3 | 2.3 | 2.2 |

(In the table, the cutting test results of the conventional surface coated tools show cutting duration (minutes) until the tool lives of use are expired due to fine chipping, fracturing, delamination, and the like occurring in the hard coating layers.)

Based on the results shown in Table 5, it was demonstrated that the surface coated tools A1 to A13 of the present invention had the interface structures satisfying $4 \leq b1/a1 \leq 20$, when b1/a1 is the ratio of b1 to a1. a1 was the number of Ti compound crystal grains in the lower layer side touching the interface between the first lower layer and the first upper layer. b1 was the number of $Al_2O_3$ crystal grains in the upper layer side touching the interface between the first lower layer and the first upper layer. It was also demonstrated that the average grain diameter of crystal grains in the Ti compound layer immediately below the upper layer ($Al_2O_3$ layer) was 0.5 μm or less.

Based on the results shown in Table 7, it was demonstrated that the interlayer adhesion strength between the lower layer and the upper layer was particularly increased, and, consequently, even in a case in which the coated tool was used in a high-speed intermittent cutting process in which high temperatures were generated, and high load was applied to cutting edges, the hard coating layer had excellent interlayer adhesion strength, and therefore the surface coated cutting tools of the present invention exhibited excellent wear resistance over a long period of use without occurrence of fine chipping, delamination, and the like at the cutting edges.

Based on the results shown in Tables 6 and 7, it was demonstrated that the conventional surface coated tools A1 to A13 did not have the interface structures between the lower and upper layers of the hard coating layer formed in the surface coated tools of the present invention. As a result, the interlayer adhesion strength of the hard coating layer was not sufficient under conditions of high-speed intermittent cutting conditions, and therefore fine chipping, defects, delamination, and the like occurred in the hard coating layer, and the tool life of use expired within a relatively short period of time.

Example 2

As raw material powder of a cutting tool body made of a WC-based cemented carbide, WC powder, TiC powder, ZrC powder, VC powder, TaC powder, NbC powder, $Cr_3C_2$ powder, TiN powder, TaN powder, and Co powder, all of which had an average grain diameter of 2 μm to 4 μm, were prepared, and the raw material powder was mixed into the mixture compositions as shown in Table 8. Next, wax was added to the mixture, mixed in acetone for 24 hours using a ball mill, dried under reduced pressure, and then pressed into a green compact having a predetermined shape at a pressure of 98 MPa. Next, the compact was vacuum-sintered under conditions in which the compact was held at a predetermined temperature in a range of 1370° C. to 1470° C. under a vacuum of 5 Pa for 1 hour. After the sintering, a honing process with R: 0.07 mm was carried out on the cutting edge portion, and cutting tool bodies 2A to 2F made of a WC-based cemented carbide having an insert shape, which is defined in ISO CNMG 160412, were manufactured.

As raw material powder of a cutting tool body made of a TiCN-based cermet, TiCN (TiC/TiN=50/50 by the mass ratio) powder, $Mo_2C$ powder, ZrC powder, NbC powder, TaC powder, WC powder, Co powder, and Ni powder, all of which had an average grain diameter of 0.5 μm to 2 μm, were used. Next, the raw material powder was mixed into the mixture compositions as shown in Table 9, wet-mixed for 24 hours using a ball mill, dried, and then pressed into a green compact at a pressure of 98 MPa. Next, the green compact was held in a nitrogen atmosphere of 1.3 kPa under conditions of a temperature of 1540° C. for 1 hour, and sintered. After the sintering, by performing a honing process with R: 0.07 mm on the cutting edge portion 1, cutting tool bodies 2a to 2f made of a TiCN-based cermet having an insert shape, which is defined in ISO CNMG 160412, were formed.

Next, portions other than the cutting edge portion 1 were covered with a hard urethane rubber or the like, and a wet blast treatment was carried out only on the cutting edge portion 1 by spraying a polishing solution in which 15% by mass to 60% by mass of $Al_2O_3$ fine grains was mixed with respect to the total amount with water.

Next, the cutting tool bodies 2A to 2F and the cutting tool bodies 2a to 2f were placed in an ordinary chemical vapor deposition apparatus, and Ti compound layers having the combinations and the target layer thicknesses as shown in Table 12 were formed by vapor-deposition as the second lower layer of the second hard coating layer under conditions as shown in Table 10 (1-TiCN in Table 10 represents forming conditions of a TiCN layer having the columnar crystal structure as described in JP-A-H6-8010, and the others represent forming conditions of an ordinary granular crystal structure).

Next, a pretreatment for deposition of $Al_2O_3$ was carried out on the surface of the second lower layer under conditions as shown in Table 11.

Next, $Al_2O_3$ layers having the combinations and the target layer thicknesses as shown in Table 12 were formed by vapor-deposition as the second upper layer under the conditions as shown in Table 10, and the surface coated tools B1 to B13 of the present invention were manufactured.

For a comparison purpose, the conventional surface coated tools B1 to B13 shown in Table 13 were also manufacture. The conventional surface coated tools B1 to B13 were produced in the same way to the surface coated tools B1 to B13 of the present invention by vapor-depositing the lower layer (Ti compound layer) and the upper layer ($Al_2O_3$ layer), except for not performing the pretreatment prior to $Al_2O_3$ vapor-deposition on the surface of the lower layer.

Next, cross sections were measured through dark-field observation using a transmission electron microscope (50000 times) at 10 points near the interface between the lower layer and the upper layer in the cutting edge portion 1 and the flank face portion 2 in the hard coating layer of each of the surface coated tools B1 to B13 of the present invention and the conventional surface coated tools B1 to B13. A 25 μm straight-line parallel to the surface of the carbide substrate was defined as the measurement width. At the 10 points, the 25 μm straight-lines were placed and the numbers of the Ti compound grains having the interface with an $Al_2O_3$ grain (a1 and a2), and the numbers of $Al_2O_3$ grains having the interface with a Ti compound grain (b1 and b2) were counted in the measurement width. Values of b1/a1 and b2/a2 were obtained from a1, b1, a2, and b2 obtained in the above manner.

Tables 12 and 13 show values of a1, b1, b1/a1, a2, b2, and b2/a2 obtained by the above measurement. Since it was confirmed that the values of a1, b1, and b1/a1 of the flank face portion 2 and the rake face portion 3 were almost the same in all of the coated tools, only the values in the flank face portion 2 were shown, and the values of the cutting portion 3 were not shown.

FIG. 1 shows the cutting edge portion 1, the flank face portion 2, and the rake face portion 3 using a cross-sectional view of the cutting tool. The cutting tool portion 1 includes an area that firstly comes into contact with a work piece in a cutting process, and is constituted by a curved surface present between the flank faces and the rake face in the cutting tool.

Figure 4:
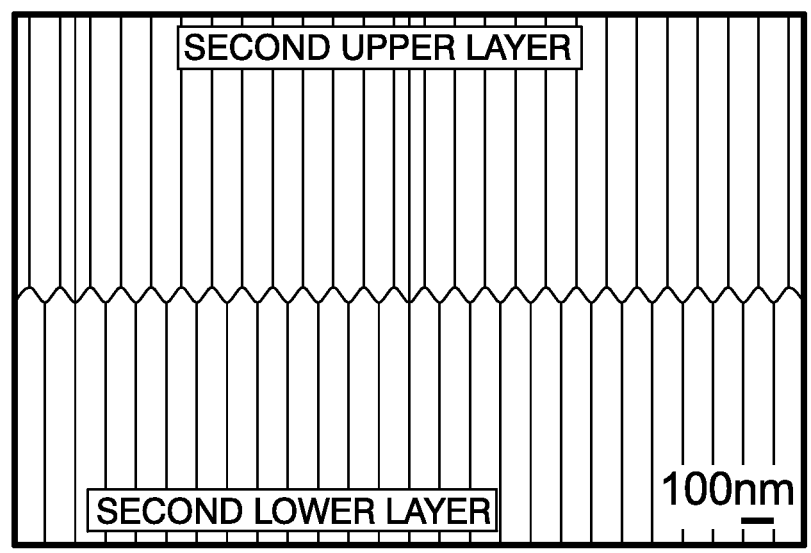
FIG. 4 is a schematic view of an interface structure of an interface between the second lower layer and the second upper layer at the cutting edge portion 1 of the coated tool B1 of the present invention. The schematic view was created based on a transmission electron microscopic photograph.

FIG. 4 shows a schematic view of an interface structure of an interface between the second lower layer and the second upper layer at the cutting edge portion 1 of the surface coated tool B1 of the present invention. The schematic view was prepared using a transmission electron microscopic photograph.

Figure 5:
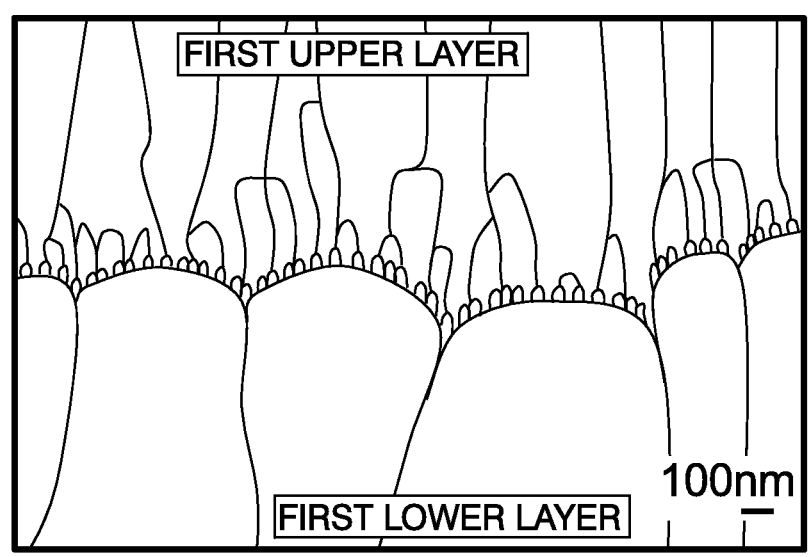
FIG. 5 is a schematic view of an interface structure of the interface between the first lower layer and the first upper layer at the flank portion 2 of the coated tool B1 of the present invention. The schematic view was created based on a transmission electron microscopic photograph.

FIG. 5 shows a schematic view of an interface structure of the interface between the first lower layer and the first upper layer at the flank face portion 2 of the surface coated tool B1 of the present invention. The schematic view was prepared using a transmission electron microscopic photograph.

Figure 6:
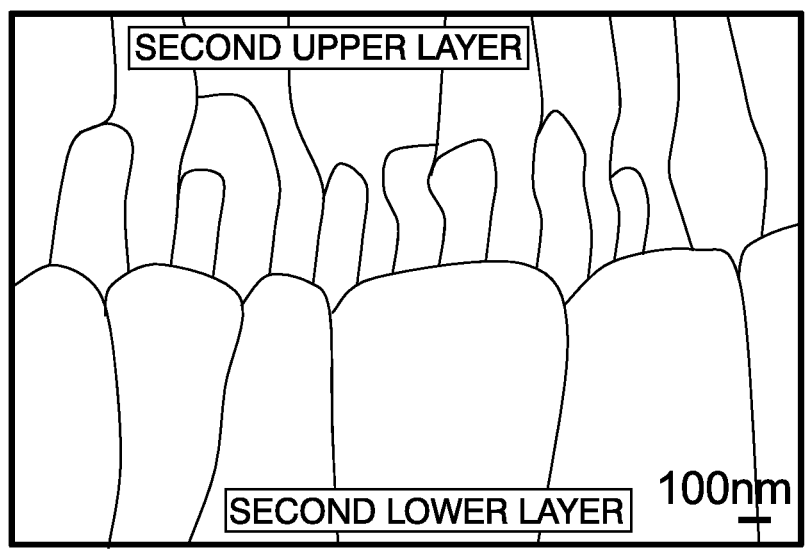
FIG. 6 is a schematic view of an interface structure of the interface between the second lower layer and the second upper layer at the cutting edge portion 1 of the conventional coated tool B1. The schematic view was created based on a transmission electron microscopic photograph.

FIG. 6 shows a schematic view of an interface structure of the interface between the second lower layer and the second upper layer at the cutting edge portion 1 of the conventional surface coated tool B1. The schematic view was prepared using a transmission electron microscopic photograph.

Figure 7:
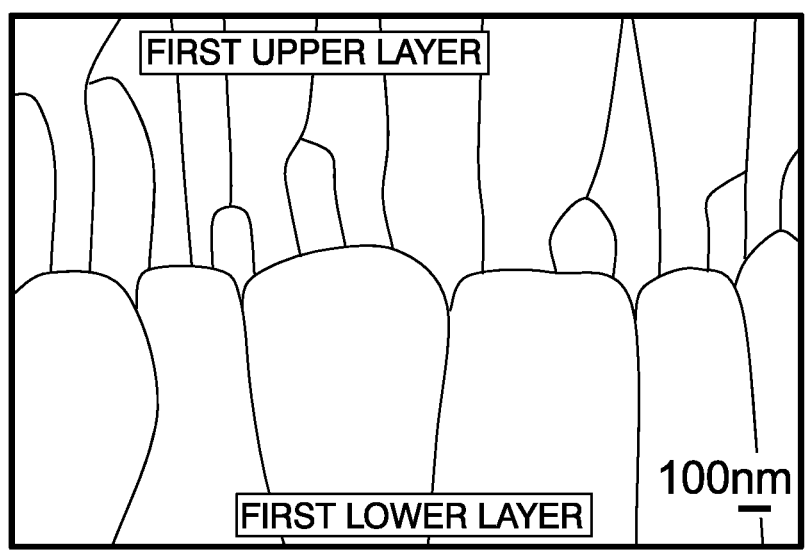
FIG. 7 is a schematic view of an interface structure of the interface between the first lower layer and the first upper layer at the flank portion 2 of the conventional coated tool B1. The schematic view was created based on a transmission electron microscopic photograph.

FIG. 7 shows a schematic view of an interface structure of the interface between the first lower layer and the first upper layer at the flank face portion 2 of the conventional surface coated tool B1. The schematic view was prepared using a transmission electron microscopic photograph.

Regarding the Ti compound in the lower layers in the hard coating layers of the surface coated tools B1 to B13 of the present invention and the conventional surface coated tools B1 to B13, a 50 μm-long line was drawn in the parallel direction to the surface of the carbide substrate on a cross section observed using a transmission electron microscope. Then, the number of intersections with crystal grain boundaries of the crystal grains in the Ti compound layer immediately below the $Al_2O_3$ layer was counted, and an average grain diameter was obtained from the average intervals of the segments.

Table 12 shows the measured average grain diameters.

Furthermore, the thicknesses of component layers of the hard coating layers of the surface coated tools B1 to B13 of the present invention and the conventional surface coated tools B1 to B13 were measured (vertical cross section measurement) using a scanning electron microscope. Based on the results, all the thicknesses of the component layers of the hard coating layers had the average layer thickness (average value of 5 point-measurement), which was substantially the same as the target layer thickness.

Next, dry high-speed intermittent cutting tests of carbon steel were carried out on the surface coated tools B1 to B13 of the present invention and the conventional surface coated tools B1 to B13 under three conditions as shown below. All the tests were carried out in a state in which the coated tools were screw-fastened to the front end portion of a tool steel bite with a fixing jig.

[Cutting Condition 2A]

A dry high-speed intermittent cutting test (an ordinary cutting speed is 200 m/min.) of nickel chrome molybdenum steel was carried out under conditions below.

Work piece: a round rod of JIS-SNCM 420 having 4 vertical grooves at equal intervals in the length direction Cutting speed: 360 m/min
Cutting depth: 0.95 mm
Feeding: 0.40 mm/rev
Cutting time: 15 minutes

[Cutting Condition 2B]

A dry high-speed intermittent cutting test (an ordinary cutting speed is 180 m/min.) of cast iron was carried out under conditions below.

Work piece: a round rod of JIS-FCD 500 having 4 vertical grooves at equal intervals in the length direction Cutting speed: 340 m/min
Cutting depth: 0.95 mm
Feeding: 0.50 mm/rev
Cutting time: 15 minutes

[Cutting Condition 2C]

A dry high-speed intermittent cutting test (an ordinary cutting speed is 250 m/min.) of carbon steel was carried out under conditions below.

Work piece: round rods of JIS-S30C having 4 vertical grooves at equal intervals in the length direction Cutting speed: 385 m/min
Cutting depth: 0.90 mm
Feeding: 0.8 mm/rev
Cutting time: 15 minutes In all of the cutting tests, abrasion widths on the flank face of cutting edges were measured.

The measurement results are shown in Table 14.

TABLE 8

| | Type | | Mixture composition (mass %) | | | | | | | | |
|---|---|---|---|---|---|---|---|---|---|---|---|
| | | | Co | TiC | ZrC | VC | TaC | NbC | $Cr_3C_2$ | TiN | TaN | WC |
| Cutting tool body | 2A | 7 | — | — | — | — | — | — | — | — | Remainder |
| | 2B | 5.7 | — | — | — | 1.5 | 0.5 | — | 1.2 | — | Remainder |
| | 2C | 5.7 | 2.3 | — | — | — | — | 1 | — | — | Remainder |
| | 2D | 8.5 | — | 0.5 | — | — | — | 0.5 | — | — | Remainder |
| | 2E | 12.5 | 2 | — | — | — | — | — | 1 | 2 | Remainder |
| | 2F | 9.8 | — | — | 0.2 | — | 4 | 0.8 | — | — | Remainder |

TABLE 9

| | Type | Mixture composition (mass %) | | | | | | | |
|---|---|---|---|---|---|---|---|---|---|
| | | Co | Ni | ZrC | TaC | NbC | $Mo_2C$ | WC | TiCN |
| Cutting tool body | 2a | 12 | 6 | — | 10 | — | 10 | 16 | Remainder |
| | 2b | 7 | 7 | — | 5 | — | 7.5 | — | Remainder |
| | 2c | 5 | — | — | — | 1 | 6 | 10 | Remainder |
| | 2d | 9 | 6 | — | 11 | 2 | — | — | Remainder |
| | 2e | 8 | 5 | 1 | 8 | — | 10 | 10 | Remainder |
| | 2f | 11 | 6.5 | — | 10 | — | 9.5 | 14.5 | Remainder |

TABLE 10

| Hard coating layer | | Forming conditions (the pressure and temperature of the reaction atmosphere are expressed in kPa and °C. respectively) | | |
|---|---|---|---|---|
| | Composition (numbers | | Reaction atmosphere | |
| Type | represent atomic ratios) | Reaction gas composition (volume %) | Pressure | Temperature |
| TiC layer | TiC | $TiCl_4$: 4.2%, $CH_4$: 8.5%, $H_2$: remainder | 7 | 1020 |
| TiN layer (first layer) | TiN | $TiCl_4$: 4.2%, $N_2$: 30%, $H_2$: remainder | 30 | 900 |
| TiN layer (other layers) | TiN | $TiCl_4$: 4.2%, $N_2$: 35%, $H_2$: remainder | 50 | 1040 |
| l-$TiC_{0.5}N_{0.5}$ layer | $TiC_{0.5}N_{0.5}$ | $TiCl_4$: 4.2%, $N_2$: 20%, $CH_3CN$: 0.6%, $H_2$: remainder | 7 | 900 |
| TiCN layer | $TiC_{0.5}N_{0.5}$ | $TiCl_4$: 4.2%, $N_2$: 20%, $CH_4$: 4%, $H_2$: remainder | 12 | 1020 |
| TiCO layer | $TiC_{0.5}O_{0.5}$ | $TiCl_4$: 4.2%, CO: 4%, $H_2$: remainder | 7 | 1020 |
| TiCNO layer | $TiC_{0.3}N_{0.3}O_{0.4}$ | $TiCl_4$: 4.2%, CO: 3%, $CH_4$: 3%, $N_2$: 20%, $H_2$: remainder | 20 | 1020 |
| $Al_2O_3$ layer | — | $AlCl_3$: 3%, $CO_2$: 6%, HCl: 8%, $H_2S$: 0.4%, $H_2$: remainder | 7 | 1000 |

TABLE 11

| | | Pretreatment symbols for vapor-deposition of $Al_2O_3$ | | | |
|---|---|---|---|---|---|
| Pretreatment conditions | | 2A | 2B | 2C | 2D |
| First step | Reaction gas (volume %) | $AlCl_3$: 1%, Ar: remainder | $AlCl_3$: 0.5%, Ar: remainder | $AlCl_3$: 2%, Ar: remainder | $AlCl_3$: 1.5%, Ar: remainder |
| | Atmosphere pressure (Torr) | 50 | 100 | 30 | 75 |
| | Treatment temperature (°C.) | 1000 | 800 | 750 | 900 |
| | Treatment duration (min.) | 2 | 3 | 1 | 2 |
| Second step | Reaction gas (volume %) | Ar | Ar | Ar | Ar |
| | Atmosphere pressure (Torr) | 50 | 100 | 30 | 75 |
| | Treatment temperature (°C.) | 1000 | 750 | 800 | 900 |
| | Treatment duration (min.) | 2 | 3 | 1 | 2 |
| Third step | Reaction gas (volume %) | $CO_2$: 5→1%, Ar: remainder | $CO_2$: 10→1%, Ar: remainder | $CO_2$: 3→1%, Ar: remainder | $CO_2$: 8→4%, Ar: remainder |
| | Atmosphere pressure (Torr) | 50 | 100 | 30 | 75 |
| | Treatment temperature (°C.) | 1000 | 750 | 800 | 900 |
| | Treatment duration (min.) | 10 | 5 | 20 | 15 |
| Fourth step | Reaction gas (volume %) | Ar | Ar | Ar | Ar |
| | Atmosphere pressure (Torr) | 50 | 100 | 75 | 30 |
| | Treatment temperature (°C.) | 1000 | 750 | 900 | 800 |
| | Treatment duration (min.) | 2 | 3 | 1 | 2 |

TABLE 12

| | | | Hard coating layer | | | | | | | | | | | | | |
|---|---|---|---|---|---|---|---|---|---|---|---|---|---|---|---|---|
| | | | Lower layer | | | | Average grain diameter of crystal grains immediately below the upper layer (μm) | | Upper layer | | Interface between lower layer and upper layer | | | | | |
| | | | | | | | | | Target layer thickness (μm) | Pretreatment signal | Cutting edge portion | | | Flank face portion | | |
| Type | | Cutting tool body symbol | First layer (μm) | Second layer (μm) | Third layer (μm) | Fourth layer (μm) | Cutting edge portion | Flank face portion | | | a2 value | b2 value | b2/a2 value | a1 value | b1 value | b1/a1 value |
| Surface coated | B1 | 2a | TiN (1) | l-TiCN (12.5) | TiN (1) | TiCNO (0.5) | 0.07 | 0.41 | 8 | 2A | 280 | 305 | 1.1 | 60 | 897 | 15.0 |

TABLE 12-continued

| | | | Hard coating layer | | | | | | | | | | | | |
|---|---|---|---|---|---|---|---|---|---|---|---|---|---|---|---|
| | | | Lower layer | | | | | | Upper layer | | Interface between lower layer and upper layer | | | | |
| | | | | | | | Average grain diameter of crystal grains immediately below the upper layer (μm) | | Target layer thick-ness (μm) | Pre-treat-ment signal | Cutting edge portion | | | Flank face portion | | |
| | | Cutting tool body symbol | First layer (μm) | Second layer (μm) | Third layer (μm) | Fourth layer (μm) | Cutting edge portion | Flank face portion | | | a2 value | b2 value | b2/a2 value | a1 value | b1 value | b1/a1 value |
| Type | | | | | | | | | | | | | | | | |
| tool of the present invention | B2 | 2A | TiCN (1) | l-TiCN (7.5) | TiCO (1.5) | — | 0.06 | 0.35 | 8 | 2A | 305 | 330 | 1.1 | 55 | 719 | 13.1 |
| | B3 | 2b | TiN (1) | l-TiCN (4) | TiC (2) | TiCNO (1) | 0.06 | 0.36 | 1 | 2C | 321 | 318 | 1.0 | 69 | 567 | 8.2 |
| | B4 | 2B | TiC (1) | l-TiCN (8.5) | — | — | 0.09 | 0.48 | 9 | 2B | 266 | 296 | 1.1 | 49 | 542 | 11.1 |
| | B5 | 2c | TiN (1) | l-TiCN (5.5) | TiCNO (0.5) | — | 0.04 | 0.21 | 6 | 2D | 483 | 479 | 1.0 | 81 | 472 | 5.8 |
| | B6 | 2C | TiN (0.5) | l-TiCN (1.5) | TiC (0.3) | TiCNO (0.5) | 0.03 | 0.18 | 15 | 2D | 602 | 540 | 0.9 | 100 | 400 | 4.0 |
| | B7 | 2d | TiN (0.5) | l-TiCN (10) | TiC (1.5) | TiCNO (0.3) | 0.02 | 0.12 | 7 | 2B | 820 | 733 | 0.9 | 59 | 815 | 13.8 |
| | B8 | 2D | TiN (1.5) | TiCN (18.5) | — | — | 0.1 | 0.5 | 2 | 2C | 250 | 300 | 1.2 | 71 | 954 | 13.4 |
| | B9 | 2e | TiC (0.5) | l-TiCN (10) | TiCO (0.5) | — | 0.08 | 0.39 | 4 | 2C | 283 | 315 | 1.1 | 82 | 443 | 5.4 |
| | B10 | 2E | TiN (1) | TiC (1) | TiCN (8) | TiCO (1) | 0.06 | 0.34 | 11 | 2B | 372 | 369 | 1.0 | 65 | 1022 | 15.7 |
| | B11 | 2f | TiN (1) | TiC (1) | l-TiCN (6) | — | 0.04 | 0.25 | 13 | 2A | 496 | 446 | 0.9 | 55 | 1100 | 20.0 |
| | B12 | 2F | TiC (1) | l-TiCN (4) | TiCNO (1.5) | — | 0.05 | 0.29 | 10 | 2D | 435 | 431 | 1.0 | 58 | 389 | 6.7 |
| | B13 | 2D | TiCN (1) | TiC (1.5) | TiCNO (0.5) | — | 0.01 | 0.1 | 11 | 2A | 1020 | 816 | 0.8 | 63 | 904 | 14.3 |

(The numbers in the parentheses in the lower layer column are target layer thicknesses.)

TABLE 13

| | | | Hard coating layer | | | | | | | | | | | | |
|---|---|---|---|---|---|---|---|---|---|---|---|---|---|---|---|
| | | | Lower layer | | | | | | Upper layer | | Interface between lower layer and upper layer | | | | |
| | | | | | | | Average grain diameter of crystal grains immediately below the upper layer (μm) | | Target layer thick-ness (μm) | Pre-treat-ment signal | Cutting edge portion | | | Flank portion | | |
| | | Cutting tool bodie-signal | First layer (μm) | Second layer (μm) | Third layer (μm) | Fourth layer (μm) | Cutting edge portion | Flank face portion | | | a2 value | b2 value | b2/a2 value | a1 value | b1 value | b1/a1 value |
| Type | | | | | | | | | | | | | | | | |
| Conven-tional surface coated tool | B1 | 2a | Same as the surface coated tool B1 of the present invention | | | | 0.39 | 0.41 | 8 | — | 61 | 170 | 2.8 | 56 | 182 | 3.3 |
| | B2 | 2A | Same as the surface coated tool B2 of the present invention | | | | 0.38 | 0.35 | 8 | — | 63 | 194 | 3.1 | 62 | 179 | 2.9 |
| | B3 | 2b | Same as the surface coated tool B3 of the present invention | | | | 0.36 | 0.36 | 1 | — | 58 | 113 | 1.9 | 63 | 154 | 2.4 |
| | B4 | 2B | Same as the surface coated tool B4 of the present invention | | | | 0.43 | 0.48 | 9 | — | 54 | 181 | 3.4 | 52 | 153 | 2.9 |
| | B5 | 2c | Same as the surface coated tool B5 of the present invention | | | | 0.23 | 0.21 | 6 | — | 96 | 195 | 2.0 | 101 | 205 | 2.0 |
| | B6 | 2C | Same as the surface coated tool B6 of the present invention | | | | 0.19 | 0.18 | 15 | — | 113 | 151 | 1.3 | 116 | 104 | 0.9 |
| | B7 | 2d | Same as the surface coated tool B7 of the present invention | | | | 0.11 | 0.12 | 7 | — | 60 | 172 | 2.9 | 61 | 185 | 3.0 |

TABLE 13-continued

| | | | | | | Lower layer | | | | | | | | | |
|---|---|---|---|---|---|---|---|---|---|---|---|---|---|---|---|
| | | | | | | Average grain diameter of crystal grains immediately below the upper layer (μm) | | Upper layer | | Interface between lower layer and upper layer | | | | | |
| | | Cutting tool bodie-signal | First layer (μm) | Second layer (μm) | Third layer (μm) | Fourth layer (μm) | | | Target layer thick-ness (μm) | Pre-treat-ment signal | Cutting edge portion | | | Flank portion | | |
| Type | | | | | | | Cutting edge portion | Flank face portion | | | a2 value | b2 value | b2/a2 value | a1 value | b1 value | b1/a1 value |
| | B8 | 2D | Same as the surface coated tool B8 of the present invention | | | | 0.47 | 0.5 | 2 | — | 57 | 110 | 1.9 | 55 | 106 | 1.9 |
| | B9 | 2e | Same as the surface coated tool B9 of the present invention | | | | 0.38 | 0.39 | 4 | — | 64 | 109 | 1.7 | 61 | 80 | 1.3 |
| | B10 | 2E | Same as the surface coated tool B10 of the present invention | | | | 0.29 | 0.34 | 11 | — | 69 | 90 | 1.3 | 67 | 68 | 1.0 |
| | B11 | 2f | Same as the surface coated tool B11 of the present invention | | | | 0.24 | 0.25 | 13 | — | 52 | 119 | 2.3 | 54 | 74 | 1.4 |
| | B12 | 2F | Same as the surface coated tool B12 of the present invention | | | | 0.28 | 0.29 | 10 | — | 61 | 167 | 2.7 | 60 | 176 | 2.9 |
| | B13 | 2D | Same as the surface coated tool B13 of the present invention | | | | 0.09 | 0.1 | 11 | — | 60 | 140 | 2.3 | 62 | 113 | 1.8 |

(The numbers in the parentheses in the lower layer column are target layer thicknesses.)

TABLE 14

| | | Flank wear width (mm) | | | | | Cutting test results (minutes) | | |
|---|---|---|---|---|---|---|---|---|---|
| Type | | Cutting conditions (2A) | Cutting conditions (2B) | Cutting conditions (2C) | Type | | Cutting conditions (2A) | Cutting conditions (2B) | Cutting conditions (2C) |
| Surface coated tool of the present invention | B1 | 0.11 | 0.13 | 0.15 | Conventional surface coated tool | B1 | 10 | 9 | 9 |
| | B2 | 0.13 | 0.14 | 0.16 | | B2 | 9 | 8 | 9 |
| | B3 | 0.21 | 0.22 | 0.24 | | B3 | 6 | 6 | 6 |
| | B4 | 0.14 | 0.15 | 0.15 | | B4 | 8 | 8 | 7 |
| | B5 | 0.25 | 0.26 | 0.27 | | B5 | 6 | 5 | 5 |
| | B6 | 0.27 | 0.28 | 0.30 | | B6 | 4 | 3 | 3 |
| | B7 | 0.15 | 0.16 | 0.16 | | B7 | 9 | 8 | 8 |
| | B8 | 0.13 | 0.14 | 0.15 | | B8 | 9 | 8 | 9 |
| | B9 | 0.20 | 0.22 | 0.22 | | B9 | 7 | 7 | 7 |
| | B10 | 0.14 | 0.15 | 0.16 | | B10 | 9 | 9 | 8 |
| | B11 | 0.10 | 0.11 | 0.11 | | B11 | 9 | 8 | 8 |
| | B12 | 0.21 | 0.22 | 0.20 | | B12 | 5 | 5 | 4 |
| | B13 | 0.13 | 0.14 | 0.14 | | B13 | 8 | 7 | 8 |

(In the table, the cutting test results of the related art coated tools show cutting duration (minutes) until the tool lives of use are expired due to fine chipping, fracturing, delamination, and the like occurring in the hard coating layers.)

Based on the results shown in Table 12, it was demonstrated that the surface coated tools B1 to B13 of the present invention had the interface structure satisfying $0.8 \leq b2/a2 \leq 1.2$ on the cutting edge portion 1, when b2/a2 was the ratio of b2 to a2. a2 was the number of Ti compound crystal grains in the second lower layer side touching the interface between the second lower layer and the second upper layer. b2 was the number of $Al_2O_3$ crystal grains in the second upper layer side touching the interface between the second lower layer and the second upper layer. It was also demonstrated that the average grain diameter of crystal grains of crystal grains in the Ti compound layer immediately below the $Al_2O_3$ layer was 0.1 μm or less. Furthermore, it was demonstrated that the surface coated tools B1 to B13 of the present invention had the interface structures satisfying $4 \leq b1/a1 \leq 20$ on the flank face portion 2 and rake face portion 3, when b1/a1 is the ratio of b1 to a1. a1 was the number of Ti compound crystal grains in the lower layer side touching the interface between the first lower layer and the first upper layer. b1 was the number of $Al_2O_3$ crystal grains in the upper layer side touching the interface between the first lower layer and the first upper layer. It was also demonstrated that the average grain diameter of crystal grains in the Ti compound layer immediately below the upper layer ($Al_2O_3$ layer) was 0.1 μm to 0.5 μm.

Based on the results shown in Table 14, it was demonstrated that the interlayer adhesion strength between the lower layer and the upper layer was particularly increased, and, consequently, even in a case in which the coated tool was used in a high-speed intermittent cutting process to steel or cast iron in which high temperatures were generated, and intermittent high load was applied to cutting edges, the hard coating layer had excellent interlayer adhesion strength, and therefore the surface coated cutting tools of the present invention exhibited excellent wear resistance over a long period of use without occurrence of fine chipping, delamination, and the like at the cutting edges.

Based on the results shown in Tables 13 and 14, it was demonstrated that the conventional surface coated tools B1 to B13 did not have the interface structures formed in the surface coated tools of the present invention between the lower and upper layers of the hard coating layer. As a result, the interlayer adhesion strength of the hard coating layer was not sufficient under conditions of high-speed intermittent cutting conditions, and therefore fine chipping, defects, delamination, and the like occurred in the hard coating layer, and the tool life of use expired within a relatively short period of time.

INDUSTRIAL APPLICABILITY

As described above, since the coated tool of the present invention shows excellent chipping resistance and wear resistance against steel, cast iron, and the like, particularly in high-speed intermittent cutting processes in which high temperatures are generated, and high load is applied to cutting edges, and exhibits excellent cutting performance over a long period of use, performance improvement of cutting apparatuses, power saving and energy saving of cutting processes, and, furthermore, cost reduction can be sufficiently expected.

BRIEF DESCRIPTION OF THE REFERENCE SYMBOLS

1  CUTTING EDGE PORTION
2  FLANK FACE PORTION
3  RAKE FACE PORTION

The invention claimed is:

1. A surface coated cutting tool comprising:
a cutting tool body made of tungsten carbide-based cemented carbide or titanium carbide-based cermet;
a first hard coating layer vapor-deposited on at least a part of the surface of the cutting tool body; and
a second hard coating layer vapor-deposited on a surface of a cutting edge portion of the cutting tool body, when a tool area is divided into three areas composed of the cutting edge portion, a flank face portion, and a rake face portion,
wherein the first hard coating layer comprises
a first lower layer vapor-deposited on the surface of the cutting tool body, and
a first upper layer vapor-deposited on the surface of the first lower layer,
wherein the first lower layer comprises one or more Ti compound layers selected from a group consisting of a Ti carbide layer, a Ti nitride layer, a Ti carbonitride layer, a Ti carboxide layer, and a Ti oxycarbonitride layer;
the first upper layer comprises an $Al_2O_3$ layer;
a ratio of b1 to a1, which is b1/a1, satisfies the formula, $4 \leq b1/a1 \leq 20$, a1 being the number of crystal grains on the Ti compound layer side touching the interface between the first lower layer and the first upper layer, and b1 being the number of crystal grains on the $Al_2O_3$ layer side touching the interface between the first lower layer and the first upper layer; and
an average diameter of crystal grains in the Ti compound layer directly below the $Al_2O_3$ layer of the first upper layer is 0.5 μm or less, wherein
the second hard coating layer comprises: a second lower layer vapor-deposited on the surface of the cutting edge portion of the cutting tool body; and
a second upper layer vapor-deposited on the surface of the second lower layer, wherein
the second lower layer comprises one or more Ti compound layers selected from a group consisting of a Ti carbide layer, a Ti nitride layer, a Ti carbonitride layer, a Ti carboxide layer, and a Ti oxycarbonitride layer;
the second upper layer comprises an $Al_2O_3$ layer with an α-type crystal structure;
a ratio of b2 to a2, which is b2/a2, satisfies the formula, $0.8 \leq b2/a2 \leq 1$, a2 being the number of crystal grains on the Ti compound layer side touching the interface between the second lower layer and the second upper layer, and b2 being the number of crystal grains on the $Al_2O_3$ layer side touching the interface between the second lower layer and the second upper layer;
an average diameter of crystal grains in the Ti compound layer directly below the $Al_2O_3$ layer of the second upper layer is 0.1 μm or less, and
the flank face portion and the rake face portion are coated with the first hard coating layer.

2. The surface coated cutting tool according to claim 1, wherein, the average overall layer thickness of the first lower layer is 3 μm to 20 μm, and
the average layer thickness of the first upper layer is 1 μm to 15 μm.

3. The surface coated cutting tool according to claim 1, wherein the average overall layer thickness of the second lower layer is 3 μm to 20 μm, and
the average layer thickness of the second upper layer is 1 μm to 15 μm.

4. The surface coated cutting tool according to claim 2, wherein an average diameter of crystal grains in the Ti compound layer, which is included in the first lower layer and located directly below the $Al_2O_3$ layer of the first upper layer, is 0.1 μm to 0.5 μm.

5. The surface coated cutting tool according to claim 3, wherein an average diameter of crystal grains in the Ti compound layer, which is included in the first lower layer and located directly below the $Al_2O_3$ layer of the first upper layer, is 0.1 μm to 0.5 μm.

* * * * *